(12) United States Patent
Rössinger et al.

(10) Patent No.: US 9,052,235 B2
(45) Date of Patent: Jun. 9, 2015

(54) INFRARED SENSOR AND USE OF SAME

(75) Inventors: Stefan Rössinger, Erkrath (DE); Tobias Schäpertöns, Dortmund (DE); Michael Basel, Dortmund (DE)

(73) Assignee: MEAS DEUTSCHLAND GMBH, Dortmund (DE)

( * ) Notice: Subject to any disclaimer, the term of this patent is extended or adjusted under 35 U.S.C. 154(b) by 1 day.

(21) Appl. No.: 14/123,049

(22) PCT Filed: Jun. 1, 2012

(86) PCT No.: PCT/EP2012/002328
§ 371 (c)(1),
(2), (4) Date: Mar. 24, 2014

(87) PCT Pub. No.: WO2012/163539
PCT Pub. Date: Dec. 6, 2012

(65) Prior Publication Data
US 2014/0291521 A1    Oct. 2, 2014

(30) Foreign Application Priority Data
Jun. 1, 2011    (DE) .......................... 10 2011 103 818

(51) Int. Cl.
*H01L 27/14* (2006.01)
*G01J 5/08* (2006.01)
*G01J 5/02* (2006.01)
(Continued)

(52) U.S. Cl.
CPC .............. *G01J 5/0862* (2013.01); *G01J 5/0205* (2013.01); *G01J 5/06* (2013.01); *G01J 5/089* (2013.01); *G01J 5/0893* (2013.01); *H01L 31/0232* (2013.01); *G01J 5/0809* (2013.01)

(58) Field of Classification Search
USPC ............................................. 250/338.4, 353
See application file for complete search history.

(56) References Cited

U.S. PATENT DOCUMENTS 4,384,207 A * 5/1983 Doctor .......................... 250/349
4,495,416 A   1/1985 Mason et al.
4,626,686 A   12/1986 Pompei et al.
(Continued)

FOREIGN PATENT DOCUMENTS

DE          19 14 468 A1    11/1970
DE       10 2004 030418 A1   1/2006
WO        WO201004505 A2    1/2010

OTHER PUBLICATIONS

International Search Report for PCT/EP2012/002328, dated Aug. 23, 2012.

*Primary Examiner* — David J Makiya
*Assistant Examiner* — Taeho Jo
(74) *Attorney, Agent, or Firm* — Howard IP Law Group, PC

(57) ABSTRACT

An infrared (IR) sensor package includes a heat sink defining a first interior space and a radiation trap adjacent the first interior space. An IR sensor having a radiation-sensitive region which detects IR radiation is arranged within the first interior space of the heat sink. A first optical element and a second optical element are arranged at respective ends of the radiation trap. The radiation trap is configured to allow for the passage of a first portion of IR radiation incident the second optical element, through the first optical element, and into communication with the IR sensor element, and to absorb a second portion of IR radiation incident the second optical element.

20 Claims, 1 Drawing Sheet

(51) Int. Cl.
*G01J 5/06* (2006.01)
*H01L 31/0232* (2014.01)

(56) References Cited

U.S. PATENT DOCUMENTS

| | | | |
|---|---|---|---|
| 4,797,840 A * | 1/1989 | Fraden | 702/104 |
| 4,933,559 A * | 6/1990 | Tamura et al. | 250/338.3 |
| 4,970,403 A * | 11/1990 | Krasutsky | 250/216 |
| 4,986,672 A | 1/1991 | Beynon | |
| 5,018,872 A | 5/1991 | Suszynski et al. | |
| 5,672,875 A * | 9/1997 | Block et al. | 250/343 |
| 5,721,430 A * | 2/1998 | Wong | 250/339.13 |
| 6,133,569 A * | 10/2000 | Shoda et al. | 250/332 |
| 7,157,706 B2 * | 1/2007 | Gat et al. | 250/338.1 |
| 2003/0118076 A1 * | 6/2003 | Schieferdecker et al. | 374/121 |
| 2006/0016995 A1 | 1/2006 | Kummer et al. | |
| 2006/0050416 A1 * | 3/2006 | Chung et al. | 359/819 |
| 2006/0255275 A1 * | 11/2006 | Garman et al. | 250/338.1 |
| 2008/0204757 A1 * | 8/2008 | Manning | 356/451 |
| 2012/0183013 A1 * | 7/2012 | Stein et al. | 374/130 |
| 2012/0188634 A1 * | 7/2012 | Kubala et al. | 359/356 |

* cited by examiner

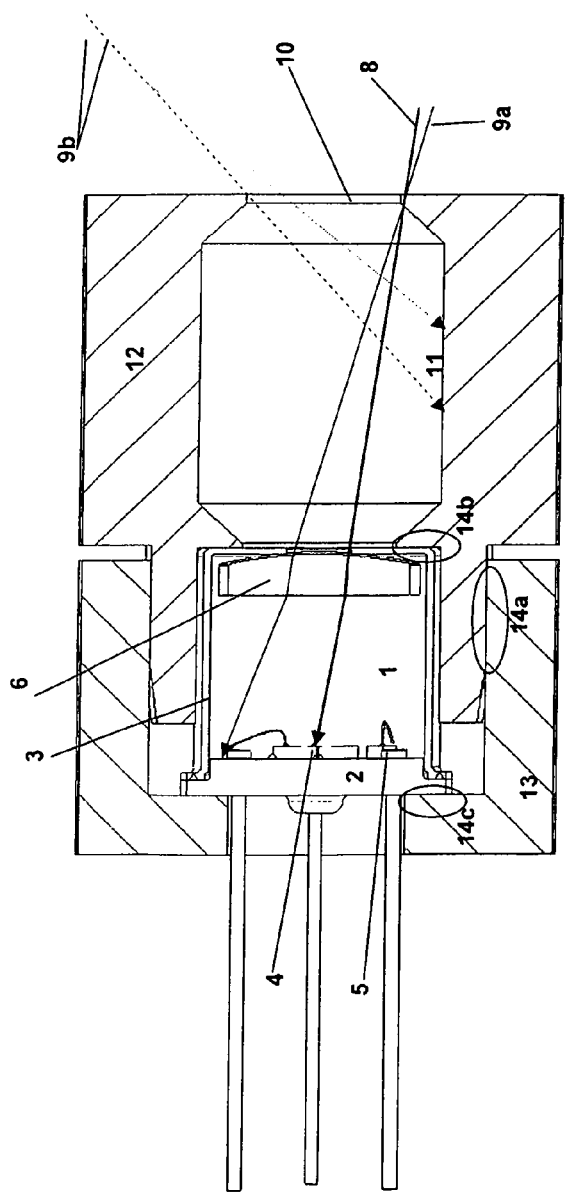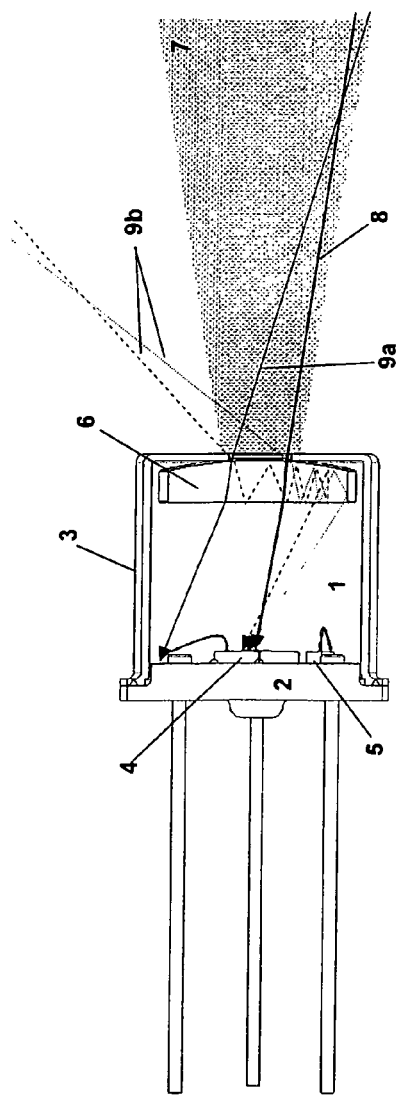
Fig. 1
Fig. 2

INFRARED SENSOR AND USE OF SAME

CROSS REFERENCE TO RELATED APPLICATIONS

This application is a national stage application under 35 U.S.C. §371 of the International Application No. PCT/EP2012/002328, filed Jun. 1, 2012, and claims the benefit of German Application No. 10 2011 103 818.7, filed Jun. 1, 2011, the entire disclosures of which are incorporated herein by reference.

FIELD OF THE INVENTION

The present invention relates to sensors, and more specifically, infrared (IR) sensor assemblies and methods of use thereof.

BACKGROUND

With such infrared sensor assemblies that are used for motion detectors and noncontact temperature measurement (pyrometry), for example, optical elements (e.g., lenses, mirrors, apertures and the like) are often provided to restrict the field of view of the infrared sensor. Likewise, protective planar windows or films are used to protect mirror lenses from environmental influences in particular.

A typical infrared sensor assembly for pyrometry comprises an IR sensor element (e.g., a thermopile radiation sensor, a pyroelectric radiation sensor, a bolometer and the like), optical elements for focusing (lenses, mirrors, etc.), apertures, filters, etc. as well as a housing, optionally in multiple parts, in which the various elements are combined as part of same.

Typical of this type of sensor is a TO housing 1 having a base plate 2 (also known as a "header") and a cap 3, in which a sensor element 4, for example, a thermopile chip, usually a reference sensor 5 for measuring the housing temperature and an optical element 6, e.g., a lens, an aperture and/or a planar window are provided (see FIG. 2). The lens and the IR sensor element define a field of view 7 of the sensor according to the laws of radiation optics. Rays 8 within this field of view reach the sensor element 4 by simple transmission. Rays 9a outside of the intended field of view do not reach the sensor element 4 by simple transmission. Nevertheless, rays 9b outside of the intended field of view can reach the sensor element 4 by multiple reflections inside the optical element 6 and may thus distort the measurements.

An IR sensor assembly with or without a lens is described in U.S. Pat. No. 4,626,686, wherein a thermopile radiation sensor is mounted from the rear in a tube, the rear side of the sensor housing not being attached to the tube. An aperture is mounted first in front of the radiation sensor (opposite the radiation incidence) with a lens and/or a planar window mounted behind the aperture. The aperture is thus placed between the sensor element and the lens and/or window, with everything together mounted in a tube, optionally comprising multiple parts.

Such sensor assemblies have various disadvantages:

IR-transparent materials often used for lenses and windows have relatively high refractive indices n (e.g., silicon n≈3.46, germanium n≈4.0, polyethylene n≈1.7), which may produce strong reflections on the interfaces. Incident IR radiation may be reflected repeatedly inside the optical element under some circumstances. Through such multiple reflections, IR radiation, which is actually outside of the calculated field of view, may reach the sensor element. This effect may also occur with mirror optics equipped with a protective window. Multiple reflections then do not occur inside the optical element itself but may occur within the combination of a mirror and a protective window.

The thermal behavior of the optical elements of the infrared sensor assembly differs from that of the actual sensor element (e.g., thermopile chip), i.e., the optical elements heat up (cool down) in relation to the actual sensor element. This results in additional thermal effects, which can also distort measurements. Uneven heating (or cooling) of the optical elements may be caused by thermal conduction and/or convection of the ambient media or by thermal radiation of the object to be measured.

The housing itself of the actual sensor (e.g., a thermopile chip in the TO-5 housing) may be heated (cooled) unevenly. The causes (thermal conduction, convection, thermal radiation) may result in thermal effects (e.g., additional IR radiation) which can distort the measurement.

U.S. Pat. No. 4,797,840 describes another known sensor assembly, wherein a tube is arranged in front of a pyroelectric sensor to restrict the field of view. The tube has a mirror plating on the inside to prevent the tube itself from heating up and then emitting IR radiation. This reduces one of the disadvantages, but mirror plating can cause multiple reflections, so that unwanted radiation from almost any angle (outside of the field of view) may reach the sensor element.

U.S. Pat. No. 5,018,872 describes how a sensor housing of an IR sensor assembly can be designed to be more thermally homogeneous by means of a heat exchange body ("heat sink"). The field of view is determined by means of an aperture and a safety window. Multiple reflections cannot be prevented completely.

WO 201004505 describes a radiation trap connected thermally to the sensor housing. However this trap is situated between the lens and/or mirror and the sensor element. This reduces the problem of uneven heating of the housing but does not eliminate the other disadvantages described above.

DE 10 2004 030 418 discloses the design of a sensor housing in which a few parts are bonded to the sensor chip on a wafer level. This composite is then inserted into a plastic or ceramic housing, where all the parts manufactured in the wafer composite are effectively thermally coupled (thermally homogeneously). However, the external aperture is only incompletely coupled to the sensor chip both thermally and structurally as well as through the choice of plastic or ceramic as the material. Distorting thermal effects may thus occur. The optics of the wafer composite, including the external aperture, cannot completely prevent multiple reflections.

Improved infrared sensors and sensor assemblies are desired.

SUMMARY

In one embodiment, an infrared (IR) sensor package is provided. The package comprises a heat sink defining a first interior space and a radiation trap adjacent the first interior space. An IR sensor element having a radiation-sensitive region which detects IR radiation is arranged within the first interior space of the heat sink. A first optical element is arranged at a first end of the radiation trap, and a second optical element arranged at a second end of the radiation trap. The radiation trap is configured to allow for the passage of a first portion of IR radiation incident the second optical element, through the first optical element, and into communication with the IR sensor element, and to absorb a second portion of IR radiation incident the second optical element.

In another embodiment, an IR sensor assembly is provided. The assembly includes an IR sensor element having a radiation-sensitive region responsive to IR radiation. A first optical element is arranged in front of the IR sensor element, and a second optical element is arranged in front of the first optical element. A radiation trap is arranged between the first optical element and the second optical element, and is configured to absorb a first portion of IR radiation incident the second optical element, and allow for the transmission of a second portion of IR radiation to the IR sensor element.

Furthermore, embodiments relate to the use of such an infrared sensor assembly or package as described above.

BRIEF DESCRIPTION OF THE DRAWINGS

The invention is explained in greater detail below on the basis of drawings which shows only exemplary embodiments, showing:

FIG. 1: one exemplary embodiment of a sensor assembly according to the invention in a schematic sectional diagram, and FIG. 2: an example of a known infrared sensor assembly.

DETAILED DESCRIPTION

The present invention provides an infrared sensor assembly, in which the problems explained in conjunction with the prior art are at least partially solved. The invention relates to an infrared (IR) sensor assembly, comprising an IR sensor element having a radiation-sensitive region which detects IR rays, a first optical element, which is situated in front of the IR sensor element, as seen in the direction of incidence. The optical element includes one or more of a refractive surface, a mirror, an aperture, and a wavelength-dependent filter. The first optical element and the size of the IR sensor element define the set of IR rays, incident from the outside, as an intended field of view of the IR sensor element. In one embodiment, the IR rays may pass only once through a refractive surface, inasmuch as this refractive surface is present as part of the first optical element. The IR rays may be reflected only once on a mirror (refractive surface is present), inasmuch as this mirror is present as part of the first optical element. The IR rays may pass through an aperture only once, inasmuch as this aperture is present as part of the first optical element. The IR rays may pass through a wavelength-dependent filter only once, inasmuch as this wavelength-dependent filter is present as part of the first optical element. The IR rays may strike the region that is sensitive to radiation and, may not be reflected on a surface situated between the optical element and where it strikes the radiation-sensitive region.

A second optical element is provided and arranged in the incident beam direction at a distance in front of the first optical element. The second optical element may include one or more of a mirror, an aperture and wavelength-dependent filter. IR rays incident from the outside is defined by the second optical element as a restricted field of view of the IR sensor element. The IR rays may pass through the first and a second optical elements, striking the radiation-sensitive region. The IR rays may not be reflected on a surface situated between the second optical element and the first optical element or between the first optical element and where it strikes the radiation-sensitive region. The IR rays may pass only once through a refractive surface, inasmuch as this refractive surface is present as part of the first optical element. The IR rays may be reflected only once on a mirror (refractive surface is present), inasmuch as this mirror is present as part of the first optical element. The IR rays may pass only once through an aperture, inasmuch as this aperture is present as part of the first optical element, pass only once through a wavelength-dependent filter, inasmuch as this wavelength-dependent filter is part of the first optical element, and pass only once through a refractive surface, inasmuch as this refractive surface is present as part of the second optical element. The IR rays may be reflected only once on a mirror (refractive surface is present), inasmuch as this mirror is present as part of the second optical element. The IR rays may pass only once through an aperture, inasmuch as this aperture is present as part of the second optical element. Finally, the IR rays may pass only once through a wavelength-dependent filter, inasmuch as this wavelength dependent filter is present as part of the second optical element.

The space defined by the distance is utilized to design a radiation trap between the first optical element and the second optical element, said trap absorbing at least a portion of the IR rays that would have to be reflected on a surface arranged between the second optical element and the first optical element, downstream from the second optical element for passage through a member of the first optical element, inasmuch as one member of the first optical element through which it can pass is present or inasmuch as a mirror is present for reflection on a mirror of the first optical element.

An infrared (IR) sensor assembly according to the invention increases the measurement accuracy of the IR sensor assembly by reducing and/or completely preventing the influence of stray radiation on the IR sensor element. Stray beams far outside of the field of view are absorbed in the radiation trap and thus become ineffective. At the same time, the field of view is restricted to such an extent that all the beams pass through the optical elements into the region of the IR sensor element without multiple interfering reflections. This effect can be refined to almost any extent by suitable coordination of the type and distance of the first and second optical elements.

IR sensor elements having a radiation-sensitive region are used for the infrared sensor assembly according to the invention. The elements forming the radiation-sensitive region are usually arranged in a plane and/or in multiple parallel planes. Therefore, the incident beam direction in particular is understood to be the direction perpendicular to these planes. The IR sensor element may be designed in particular as a thermopile radiation sensor, which is known from the prior art, as a pyroelectric radiation sensor or as a bolometer, which is also known from the prior art.

The IR sensor assembly according to the invention has first and second optical elements. The first and second optical elements may be designed similarly. However, in a particularly preferred embodiment, the second optical element is designed as an aperture and thus forms a simple opening through which the IR rays can pass.

The optical elements used according to the invention may consist of one or more components and/or may form an opening. In the simplest case, the optical element is formed by an aperture through which the IR rays pass, essentially without any change in their beam path. The opening through such an aperture may also be closed by a safety window or a safety film which will not however significantly alter the beam path of the IR rays. In another embodiment, an optical element may be designed as an element having a refractive surface, in particular as an element having two refractive surfaces, in particular preferably designed as a lens which alters the beam path of the IR rays passing through it. In another embodiment the optical element may be formed by one or more mirrors on which the IR rays are reflected. If the optical element is designed as an aperture, then the IR rays pass through the opening and optionally the protective window and/or the protective film of the aperture which closes the aperture for safety purposes. If the optical element is designed as a lens, then the IR radiation passes through the lens. If the optical element has one or more mirrors, then the IR radiation is reflected on one or more mirrors. However, it is also possible for the optical element to be formed from a combination of several mirrors and a lens, for example, so that an IR beam is reflected by the mirrors and passes through the lens.

The first optical element and the size of the IR sensor element define the set of IR rays that are incident from the outside as an intended field of view, said set of IR rays passing only once through a refractive surface, inasmuch as said refractive surface is present as part of the first optical element, being reflected only once on a mirror (refractive surface is present), inasmuch as said mirror is present as part of the first optical element, passing only once through an aperture, inasmuch as said aperture is present as part of the first optical element, passing only once through a wavelength-dependent filter, inasmuch as said wavelength-dependent filter is present as part of the first optical element, striking the radiation-sensitive region and not being reflected on a surface situated between the optical element and where it strikes the radiation-sensitive region.

Thus the following do not belong to the intended field of view:

IR rays that do not strike the radiation-sensitive region of the IR sensor element or IR rays that are incident at an angle in a lens optionally provided in the first optical element, resulting in the IR rays being reflected multiple times inside the lens, but then striking the radiation-sensitive region of the IR sensor element or IR rays striking mirrors optionally provided in the first optical element at an angle such that the IR rays are reflected repeatedly thereon or on components (mirrors, lens, filters, safety windows, etc.) optionally provided in the first optical element, then striking the radiation-sensitive region of the IR sensor element.

The second optical element defines a restricted field of view of the IR sensor element, which is understood to be the set of externally incident IR rays, which pass through the first and second optical elements, strike the radiation-sensitive region, are not reflected on a surface situated between the second optical element and the first optical element or between the first optical element and where it strikes the radiation-sensitive region, pass through a refractive surface only once, inasmuch as this refractive surface is present as part of the first optical element, being reflected only once on a mirror (refractive surface is present), inasmuch as this mirror is present as part of the first optical element, passing only once through an aperture, inasmuch as this aperture is present as part of the first optical element, passing only once through a wavelength-dependent filter, inasmuch as this wavelength-dependent filter is part of the first optical element, passing only once through a refractive surface, inasmuch as this refractive surface is present as part of the second optical element, being reflected only once on a mirror (refractive surface is present), inasmuch as this mirror is present as part of the second optical element, passing only once through an aperture, inasmuch as this aperture is present as part of the second optical element, passing only once through a wavelength-dependent filter, inasmuch as this wavelength dependent filter is present as part of the second optical element.

Thus, for example, the restricted field of view does not include, for example, IR rays emerging from the second optical element in such a manner that they would have to be reflected on an additional surface situated between passage through the second optical element and passage through the first optical element in order to then pass through the first optical element.

In the case of an arrangement of an IR sensor element (4) and a first optical element (6) consisting of a silicon lens (uncoated) (without a second optical element and without a radiation trap) which corresponds to the prior art (FIG. 2), approximately 80% of the power striking the IR sensor element would originate from the intended field of view marked by the truncated cone (7). Approximately 20% of the power striking the IR sensor element, for example, rays (9b), would reach it from the outside and would distort the measurement result.

In a preferred embodiment, in the assembly of IR sensor elements according to the invention, a first optical element, a second optical element and a radiation trap (FIG. 1), approximately 95% of the power striking the IR sensor element would originate from the intended field of view marked by the truncated cone. In such an embodiment approximately 5% or less of the power striking the IR sensor element would arrive there from the outside; for example, radiation is absorbed mostly in the radiation trap and the measurement result is distorted very little.

The radiation trap is designed in particular so that it absorbs the energy introduced by an IR beam striking its surface and conducted away from the surface, where the IR beam strikes without heating said surface. This may be achieved by means of a radiation trap, for example, which is made at least in part of a material that is a good heat conductor, for example, a metal, e.g., aluminum, copper, magnesium, zinc, or a semiconductor, for example, silicon, or a ceramic material used in semiconductor technology. The radiation trap may also be designed to at least partially absorb the energy introduced through an IR beam striking its surface, and the surface heats up only due to a portion of the incident energy.

In a preferred embodiment, the first and second optical elements have a circular or elliptical outer circumference. In such a preferred embodiment, the radiation trap has a circular or elliptical through-channel in particular, wherein the first optical element is arranged at one end and the second optical element is arranged at the second end of the circular or elliptical through-channel. The diameter of the circular through-channel is in particular preferably larger than the diameter of the first optical element and larger than the diameter of the second optical element. In a preferred embodiment, the through-channel is designed completely as a circular or elliptical through-channel between the first and second optical elements. In an alternative embodiment, transition surfaces which create a transition in the form of a truncated cone, for example, from a smaller diameter of the first and/or second optical element to the larger diameter of the through-channel, are provided on one end of the through-channel, where the first optical element is arranged and/or on the end of the through-channel, where the second optical element is arranged.

In a preferred embodiment, lenses and/or mirrors which can focus IR beams, arriving as a beam bundle with a first cross-sectional area, on a radiation-sensitive region of the IR sensor element, having a second smaller cross-sectional area, are provided in one or both optical elements.

The IR sensor assembly according to the invention has a radiation trap between the first optical element and the second optical element, absorbing at least a portion of the IR rays that would have to be reflected on at least one surface for passage through the first optical element after passing through the second optical element. In addition, the surface of the radiation trap may have structures which improve absorption, for example, roughening, grooving, pyramids, trapezoids, for example, it may be embodied as a thread, etc.

According to a preferred embodiment, the IR sensor element is arranged in a housing forming an interior space. In particular one component of the housing is a base plate holding the IR sensor element. Such a housing protects the IR sensor element, making it possible to design the immediate surroundings of the IR sensor element in a particular way, for example, to provide a filling gas or a vacuum, and it allows good handling of the IR sensor element on the manufacturing end without running any risk of damage because only the housing need be handled in subsequent manufacturing steps. Arranging the IR sensor element on a base plate makes it possible to pass the connecting lines for the IR sensor element through this base plate. The housing is in particular preferably designed as a TO, LCC or CSP housing (TO=transistor outline, LCC=leadless ceramic chip carrier, CSP=chip scale package).

In a preferred embodiment, the material or the combination of materials of which the base plate is made has a thermal conduction coefficient of more than 1 W/mK, in particular preferably more than 10 W/mK.

In a preferred embodiment, the optical element is designed as a component connected to the housing. This makes it possible to adjust and define the settings of the geometric arrangement of the optical element relative to the IR sensor element that are important for the detection of the IR rays and to do so at an early step in the manufacturing process without running any risk that this geometric ratio will be affected detrimentally in subsequent manufacturing steps. Alternatively, the housing may also be sealed by a flat window. In such a case, the optical element may be arranged at distance from the housing.

In a preferred embodiment, a reference sensor is provided, preferably being positioned in particular together with the IR sensor element on the base plate or integrated into the IR sensor element. The reference sensor permits a particularly simple and accurate calibration of the IR sensor element as a function of the ambient temperature. The arrangement on a shared base plate and/or integrated into the IR sensor element is especially advantageous in terms of the manufacturing technology.

In a preferred embodiment, the optically and thermally active elements are linked together by a heat sink. The heat sink may be designed in one or more parts. A heat sink can reduce local temperature differences among the individual components, for example, the IR sensor element, the optical elements and the radiation trap, so that only the radiation within the field of view is taken into account in the measurement and no "internal radiation," created due to local heating, distorts the measurement result. It is especially advantageous here if the optically and thermally active elements are linked together by a heat sink. For example, the IR radiation is absorbed by the radiation trap, resulting in the radiation trap heating up and again being able to emit its own IR radiation. If the radiation trap is connected to a heat sink and/or if the radiation trap forms a part of the heat sink, then at least a portion of the energy acquired by the absorption of IR radiation can be dissipated by way of the heat sink, without heating up the radiation trap or creating its own IR radiation ("internal radiation").

Optically active elements are understood to be elements having a surface which the IR radiation strikes or through which the IR radiation passes, in particular the IR sensor element and the optically relevant components of the optical element. Thermally active elements of an IR sensor assembly include in particular each mass body which may emit thermal radiation. The heat sink provided in the preferred embodiment may be used to form a second optical element designed as an aperture and/or to form the radiation trap. Advantages of this embodiment have already been achieved when some of the optically and thermally active elements are linked together via a heat sink. All the optically and thermally active elements are in particular preferably linked together by a heat sink.

In one embodiment, in which the IR sensor element is arranged in a housing, which is closed with a base plate carrying the IR sensor element, the heat sink is preferably arranged outside of the housing but in particular is linked to the base plate and optionally to other regions of the housing in a thermally conducting manner. In one alternative embodiment, the housing may form part of the heat sink.

In a preferred embodiment, the heat sink is comprised of such constituents as copper, aluminum, magnesium and/or zinc and is preferably made entirely of one of these materials in particular. It has been found that these constituents produce a particularly good homogenization of the temperature. These materials can also be processed well. Fundamentally, good heat conducting materials may be considered for the materials of the heat sink, for example, metals or semiconductors, e.g., silicon and ceramic materials used in the semiconductor field. Good heat conducting materials are understood to be in particular materials having a thermal conducting of more than 10 W/mK, in particular preferably of more than 20 W/mK. Such thermal conductivity values can also be achieved by highly heat-conducting plastics. In a preferred embodiment the heat sink has a wall thickness of greater than 1.5 mm, which additionally increases the thermal conductivity.

In a preferred embodiment, at least parts of the surfaces which the IR beams strike or through which the IR beams pass are coated with a dirt-repellant, IR radiation-permeable layer. Such layers may be made of PE (polyethylene), polypropylene (PP), PTFE (polytetrafluoroethylene) or poly-para-xylene (PPX). Such a coating is available under the brand name Parylene from the company Specialty Coating Systems, 7645 Woodland Drive, Indianapolis, Ind., 46278, USA.

The infrared sensor assembly according to the invention is preferably used in a temperature-measuring device. Such a temperature-measuring device may be a so-called pyrometer which serves to conduct a noncontact measurement of the temperature on difficultly accessible surfaces or current-carrying components (under voltage). Pyrometers are widely used as measurement devices for determining the body temperature rapidly.

The IR sensor assembly illustrated in FIG. 1 uses, as the basis, the IR sensor 4, already described in conjunction with FIG. 2, on a base plate 2 in the TO (transistor outline) housing 1. It is sheathed with a multipart heat sink ("heat sink") 12, 13. The heat sink 12, 13, made of a good heat-conducting material (e.g., glass, aluminum, copper, etc.), has thick walls (wall thickness>1.5 mm). The IR sensor assembly is constructed so that both the base plate 2 and the top side of the lens 3, 6 of the TO housing 1 and also the two parts of the heat sink 12, 13 have a good thermal connection 14a-c. This good thermal connection 14a-c may be accomplished by crimping or screwing 14a and/or by pressing 14b, c, for example.

An aperture 10 and a radiation trap 11 are integrated into the upper heat sink 12, so that they are also connected well thermally. As a result, beams 8 within the field of view still reach the sensor element 4. Beams 9a, which do not strike the sensor element 4 by simple transmission, may also still enter the housing, but beams with a larger angle of incidence 9b, which could reach the sensor element by multiple reflections, do not strike the lens 6 directly but instead are absorbed in the radiation trap 11.

The invention claimed is:

1. An infrared (IR) sensor assembly, comprising:
    an IR sensor element having a radiation-sensitive region responsive to IR radiation;
    a first optical element arranged in front of the IR sensor element;
    a second optical element arranged in front of the first optical element; and
    a radiation trap arranged between the first optical element and the second optical element, the radiation trap configured to absorb a first portion of IR radiation incident the second optical element, and allow for the transmission of a second portion of IR radiation to the IR sensor element.

2. The sensor assembly of claim 1, wherein the first optical element comprises at least one of a refractive surface, a mirror, an aperture, and a wavelength-dependent filter.

3. The sensor assembly of claim 1, wherein the second optical element comprises at least one of a refractive surface, a mirror, an aperture, and a wavelength-dependent filter.

4. The sensor assembly of claim 1, wherein the IR sensor element is mounted within a heat sink.

5. The sensor assembly of claim 4, wherein the second optical element comprises an aperture formed in the heat sink.

6. The sensor assembly of claim 4, wherein the radiation trap is formed in the heat sink.

7. The sensor assembly of claim 4, wherein the first and second optical elements are connected via the heat sink.

8. The sensor assembly of claim 4, further comprising a base plate mounted to the heat sink, wherein the IR sensor element is arranged on the base plate.

9. The sensor assembly of claim 8, further comprising a reference temperature sensor arranged on the base plate, the reference temperature sensor configured to detect an ambient temperature for calibrating the IR sensor element.

10. The sensor assembly of claim 4, wherein the heat sink is formed from at least one of aluminum, copper, magnesium, and zinc.

11. The sensor assembly of claim 1, further comprising a housing defining an interior space, wherein the IR sensor element is arranged within the interior space of the housing.

12. The sensor assembly of claim 11, wherein the housing comprises one of a transistor outline (TO), leadless ceramic chip carrier (LCC), or a chip scale package (CSP) housing.

13. The IR sensor of claim 12, wherein the first optical element is arranged adjacent to the interior of the housing.

14. An infrared (IR) sensor package, comprising:
    a heat sink defining a first interior space and a radiation trap adjacent the first interior space;
    an IR sensor element having a radiation-sensitive region for detecting IR radiation, the IR sensor arranged within the first interior space of the heat sink;
    a first optical element arranged at a first end of the radiation trap; and
    a second optical element arranged at a second end of the radiation trap;
    wherein the radiation trap is configured to allow for the passage of a first portion of IR radiation incident the second optical element, through the first optical element, and into communication with the IR sensor element, and to absorb a second portion of IR radiation incident the second optical element.

15. The sensor package of claim 14, wherein the radiation trap comprises a generally circular through-channel.

16. The sensor package of claim 14, wherein the first optical element comprises at least one of a refractive surface, a mirror, an aperture, and a wavelength-dependent filter.

17. The sensor package of claim 14, wherein the second optical element comprises at least one of a refractive surface, a mirror, an aperture, and a wavelength-dependent filter.

18. The sensor package of claim 17, wherein the second optical element comprises an aperture formed in the heat sink.

19. The sensor package of claim 14, further comprising a base plate mounted within the heat sink, wherein the IR sensor element is arranged on the base plate.

20. The sensor package of claim 19, further comprising a reference temperature sensor arranged on the base plate, the reference temperature sensor configured to detect an ambient temperature for calibrating the IR sensor element.

* * * * *